United States Patent
Huang et al.

(10) Patent No.: US 12,353,232 B2
(45) Date of Patent: Jul. 8, 2025

(54) REGULATOR CIRCUIT MODULE, MEMORY STORAGE DEVICE AND VOLTAGE CONTROL METHOD

(71) Applicant: PHISON ELECTRONICS CORP., Miaoli (TW)

(72) Inventors: Chien-Fu Huang, Hsinchu (TW); Bing-Wei Yi, Taichung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 343 days.

(21) Appl. No.: 17/992,942

(22) Filed: Nov. 23, 2022

(65) Prior Publication Data
US 2024/0118721 A1   Apr. 11, 2024

(30) Foreign Application Priority Data
Oct. 6, 2022   (TW) .................................. 111137996

(51) Int. Cl.
| | | |
|---|---|---|
| *G11C 11/34* | (2006.01) | |
| *G05F 1/575* | (2006.01) | |
| *G11C 16/30* | (2006.01) | |
| *G11C 16/04* | (2006.01) | |

(52) U.S. Cl.
CPC .............. *G05F 1/575* (2013.01); *G11C 16/30* (2013.01); *G11C 16/0483* (2013.01)

(58) Field of Classification Search
CPC ...... G05F 1/575; G11C 16/30; G11C 16/0483
USPC .................................................... 365/185.18
See application file for complete search history.

(56) References Cited

U.S. PATENT DOCUMENTS

| | | | | |
|---|---|---|---|---|
| 7,019,495 B2* | 3/2006 | Patterson | ................ | B60R 16/03 322/7 |
| 7,071,660 B2* | 7/2006 | Xu | ........................ | H02M 3/156 323/272 |
| 7,170,265 B2* | 1/2007 | Whittaker | ............... | G05F 1/575 323/267 |
| 7,421,604 B1* | 9/2008 | Mimberg | .................. | G06F 1/26 713/340 |
| 7,439,798 B2* | 10/2008 | Kouno | ...................... | G05F 1/56 327/541 |
| 7,538,709 B2* | 5/2009 | Muramatsu | ............ | H03K 5/249 341/161 |

(Continued)

FOREIGN PATENT DOCUMENTS

| | | |
|---|---|---|
| CN | 103488226 | 1/2014 |
| CN | 114756083 | 7/2022 |

(Continued)

OTHER PUBLICATIONS

"Office Action of Taiwan Counterpart Application", issued on Jul. 31, 2023, p. 1-p. 14.

(Continued)

*Primary Examiner* — Viet Q Nguyen
(74) *Attorney, Agent, or Firm* — JCIPRNET

(57) ABSTRACT

A regulator circuit module, a memory storage device, and a voltage control method are disclosed. The voltage control method includes: generating an output voltage according to an input voltage by a driving circuit; generating a feedback voltage according to the output voltage; and controlling the driving circuit by a first regulator circuit to adjust the output voltage in response to a current change caused by the feedback voltage.

27 Claims, 6 Drawing Sheets

(56) References Cited

U.S. PATENT DOCUMENTS

| | | | | |
|---|---|---|---|---|
| 7,764,111 | B2* | 7/2010 | Chiu | G05F 1/575 |
| | | | | 327/540 |
| 8,952,747 | B1* | 2/2015 | Shreeve | H02M 3/156 |
| | | | | 327/109 |
| 9,069,370 | B2* | 6/2015 | Soenen | G05F 1/575 |
| 9,342,087 | B2* | 5/2016 | Chen | G05F 1/56 |
| 9,532,420 | B2* | 12/2016 | Chen | H05B 45/3725 |
| 9,645,590 | B1* | 5/2017 | Fung | G05F 1/575 |
| 9,659,602 | B2* | 5/2017 | Qiao | H02M 3/07 |
| 10,345,840 | B1* | 7/2019 | Cao | G05F 1/575 |
| 10,558,231 | B2* | 2/2020 | Usuda | G05F 1/575 |
| 2005/0001600 | A1* | 1/2005 | Morales | H02M 3/1588 |
| | | | | 323/282 |
| 2008/0136396 | A1* | 6/2008 | Heilmann | G05F 1/56 |
| | | | | 323/298 |
| 2010/0109435 | A1* | 5/2010 | Ahmadi | G06F 1/26 |
| | | | | 307/31 |
| 2016/0334818 | A1* | 11/2016 | Singh | G05F 1/56 |
| 2017/0255214 | A1* | 9/2017 | Ho | G05F 1/56 |
| 2019/0079552 | A1* | 3/2019 | Yasusaka | G05F 1/461 |
| 2022/0236754 | A1* | 7/2022 | Dinh | G06F 1/3243 |

FOREIGN PATENT DOCUMENTS

| | | |
|---|---|---|
| TW | 201543488 | 11/2015 |
| TW | 201734694 | 10/2017 |

OTHER PUBLICATIONS

"Office Action of China Counterpart Application", issued on Jun. 10, 2023, p. 1-p. 8.

* cited by examiner

REGULATOR CIRCUIT MODULE, MEMORY STORAGE DEVICE AND VOLTAGE CONTROL METHOD

CROSS-REFERENCE TO RELATED APPLICATION

This application claims the priority benefit of Taiwan application serial no. 111137996, filed on Oct. 6, 2022. The entirety of the above-mentioned patent application is hereby incorporated by reference herein and made a part of this specification.

BACKGROUND OF THE INVENTION

Field of the Invention

The invention relates to a voltage control technique, and more particularly, to a regulator circuit module, a memory storage device, and a voltage control method.

Description of Related Art

As the size of the memory control chip gets smaller, a capacitor-less low-dropout (capless LDO) regulator is gradually applied to the packaging structure of the memory control chip. However, in the case that the capacitance of the memory control chip itself is not large enough, when encountering an instantaneous drop in voltage, if the capless LDO regulator in the memory control chip may not quickly restore the output voltage to stability, issues such as loss of digital data or even circuit damage readily occur.

SUMMARY OF THE INVENTION

The invention provides a regulator circuit module, a memory storage device, and a voltage control method that may alleviate the above issues.

An exemplary embodiment of the invention provides a regulator circuit module including a driving circuit, a feedback circuit, and a first regulator circuit. The driving circuit is configured to generate an output voltage according to an input voltage. The feedback circuit is coupled to the driving circuit and configured to generate a feedback voltage according to the output voltage. The first regulator circuit is coupled to the driving circuit and the feedback circuit. The first regulator circuit is configured to control the driving circuit to adjust the output voltage in response to a current change caused by the feedback voltage.

An exemplary embodiment of the invention further provides a memory storage device including a connection interface unit, a rewritable non-volatile memory module, a memory control circuit unit, and a regulator circuit module. The connection interface unit is configured to be coupled to a host system. The regulator circuit module is coupled to at least one of the connection interface unit, the rewritable non-volatile memory module, and the memory control circuit unit. The regulator circuit module is configured to: generate an output voltage according to an input voltage by a driving circuit; generate a feedback voltage according to the output voltage; and control the driving circuit by a first regulator circuit to adjust the output voltage in response to a current change caused by the feedback voltage.

An exemplary embodiment of the invention further provides a voltage control method used in a memory storage device. The voltage control method includes: generating an output voltage according to an input voltage by a driving circuit; generating a feedback voltage according to the output voltage; and controlling the driving circuit by a first regulator circuit to adjust the output voltage in response to a current change caused by the feedback voltage.

Based on the above, after the driving circuit generates the output voltage according to the input voltage, the feedback circuit may generate the feedback voltage according to the output voltage. Next, in response to the current change caused by the feedback voltage, the first regulator circuit may be configured to control the driving circuit to adjust the output voltage. In particular, by detecting the current change (not voltage change) caused by the feedback voltage, the efficiency of returning the output voltage to a stable state may be effectively improved.

DESCRIPTION OF THE EMBODIMENTS

A plurality of exemplary embodiments are presented below to illustrate the invention, but the invention is not limited to the plurality of exemplary embodiments illustrated. Also, appropriate combinations are allowed between the exemplary embodiments. The term "coupled to" used in the entire text of the specification of the present application (including claims) may refer to any direct or indirect connecting means. For example, if the text describes a first device is coupled to a second device, then it should be understood that the first device may be directly connected to the second device, or the first device may be indirectly connected to the second device via other devices or certain connecting means. In addition, the term "signal" may refer to at least one current, voltage, charge, temperature, data, or any other one or a plurality of signals.

Figure 1:
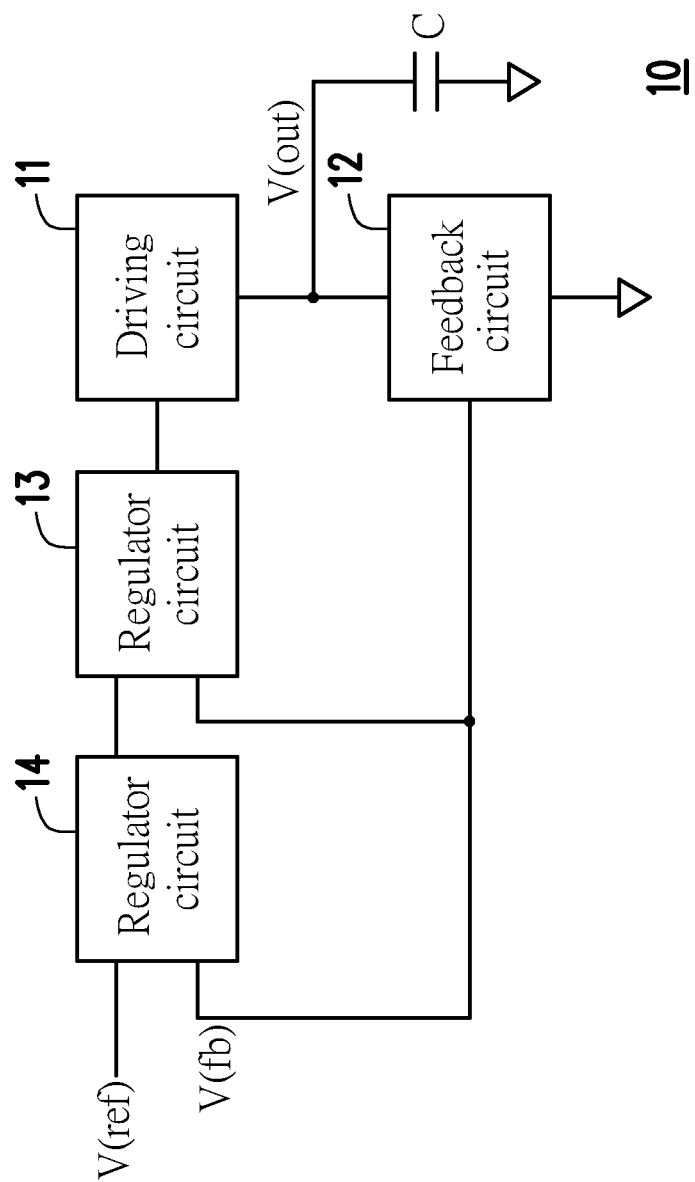
FIG. 1 is a schematic diagram of a regulator circuit module shown according to an exemplary embodiment of the invention.

FIG. 1 is a schematic diagram of a regulator circuit module shown according to an exemplary embodiment of the invention. Referring to FIG. 1, a regulator circuit module 10 may include a capless LDO regulator or a similar voltage control circuit module.

The regulator circuit module 10 includes a driving circuit 11, a feedback circuit 12, and a regulator circuit (also referred to as a first regulator circuit) 13. The driving circuit 11 may generate a voltage (also called an output voltage) V(out) according to a voltage (also called an input voltage) V(in). The voltage V(out) may be supplied to an external load. In addition, a capacitor C may be coupled to the output terminal of the driving circuit 11.

It should be mentioned that, assuming that the regulator circuit module 10 is a capless LDO regulator, the capacitance of the capacitor C (e.g., 100 picofarads (pF)) may be less than the capacitance of a larger-sized capacitor C (e.g., 1 microfarad (μF)) used in a conventional capless LDO regulator. However, the regulator circuit module 10 may also include other types of regulators, and the invention is not limited thereto.

The feedback circuit 12 is coupled to the driving circuit 11. The feedback circuit 12 may generate a voltage (also referred to as a feedback voltage) V(fb) according to the voltage V(out). The voltage V(fb) may reflect the current state of the voltage V(out). For example, the voltage value of the voltage V(fb) may be positively related to the voltage value of the voltage V(out). Therefore, when the voltage value of the voltage V(out) is suddenly dropped, the voltage value of the voltage V(fb) is also dropped correspondingly. Similarly, when the voltage value of the voltage V(out) is increased, the voltage value of the voltage V(fb) is also increased correspondingly.

A regulator circuit 13 is coupled to the driving circuit 11 and the feedback circuit 12. The regulator circuit 13 may receive the voltage V(fb). In particular, the regulator circuit 13 may control the driving circuit 11 to adjust the voltage V(out) in response to the current change caused by the voltage V(fb). The current change refers to the current change inside the regulator circuit 13.

In an exemplary embodiment, it is assumed that the voltage value of the voltage V(out) is dropped instantaneously. Compared with the traditional method of simply pulling up the voltage V(out) according to the change of the voltage V(fb) (i.e., voltage change), in response to the current change caused by the voltage V(fb) inside the regulator circuit 13, the regulator circuit 13 controls the driving circuit 11 to adjust the voltage V(out), so that the efficiency of returning the voltage V(out) to a steady state may be improved (e.g., pulling up the voltage V(out) to a preset value more quickly).

In an exemplary embodiment, the regulator circuit module 10 further includes a regulator circuit (also referred to as a second regulator circuit) 14. A regulator circuit 14 may be coupled to the feedback circuit 12 and the regulator circuit 13. The regulator circuit 14 may receive a voltage (also referred to as a reference voltage) V(ref) and the voltage V(fb). The regulator circuit 14 may control the input current of the regulator circuit 13 according to the voltage V(ref) and the voltage V(fb). For example, the regulator circuit 14 may adjust the input current inside the regulator circuit 13 according to the difference between the voltage V(ref) and the voltage V(fb) (i.e., voltage difference). The regulator circuit 13 may control the driving circuit 11 according to the input current and the voltage V(fb) to keep the voltage V(out) as stable as possible.

Figure 2:
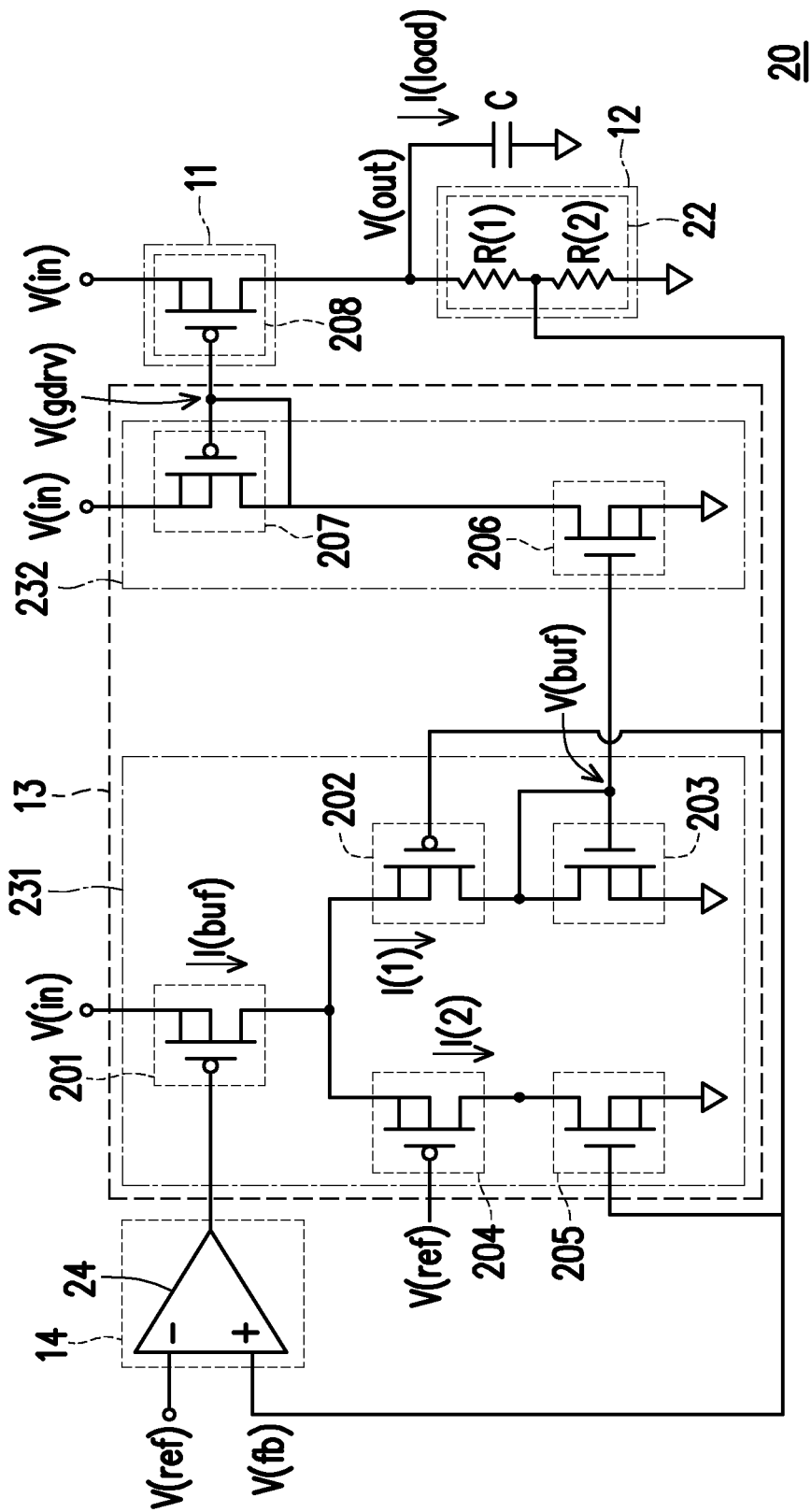
FIG. 2 is a schematic diagram of a regulator circuit module shown according to an exemplary embodiment of the invention.

FIG. 2 is a schematic diagram of a regulator circuit module shown according to an exemplary embodiment of the invention. Please refer to FIG. 2, a regulator circuit module 20 includes the driving circuit 11, the feedback circuit 12, the regulator circuit 13, and the regulator circuit 14. The driving circuit 11 may receive the voltage V(in) and generate the voltage V(out) according to the voltage V(in). A current (also called the load current) I(load) corresponding to the voltage V(out) may flow through the capacitor C. In an exemplary embodiment, if the current value of the current I(load) is increased instantaneously, the voltage value of the voltage V(out) is dropped instantaneously.

The feedback circuit 12 may include a voltage dividing circuit 22. The voltage dividing circuit 22 may be configured to divide the voltage V(out) to generate the voltage V(fb). For example, the voltage dividing circuit 22 may include impedance elements R(1) and R(2). The impedance elements R(1) and R(2) are connected in series with each other. The impedance elements R(1) and R(2) may include resistance or reactance, respectively. The impedance value (e.g., resistance value or reactance value) provided by the impedance element R(1) may be the same as or different from the impedance value provided by the impedance element R(2).

The regulator circuit 13 may include a response circuit (also referred to as a first response circuit) 231 and a response circuit (also referred to as a second response circuit) 232. The response circuit 231 is coupled to the feedback circuit 12 and the regulator circuit 14. The response circuit 232 is coupled to the response circuit 231 and the driving circuit 11.

The response circuit 231 may detect the change of the voltage V(fb) and change the current value (also known as the first current value) of a current (also referred to as the first internal current) 41) inside the regulator circuit 13 according to the change of the voltage V(fb). The current 41) is generated by dividing a current I(buf). The current I(buf) is the input current of the regulator circuit 13. For example, the voltage value of the voltage V(fb) may be negatively related to the current value (i.e., the first current value) of the internal current 41). That is, when the voltage value of the voltage V(out) is dropped instantaneously, the current value (i.e., the first current value) of the current I(1) is increased.

The response circuit 232 may adjust a voltage (also referred to as the driving voltage) V(gdrv) according to the change of the first current value. For example, the first current value may be negatively related to the voltage V(gdrv). That is, when the current value (i.e., the first current value) of the current I(1) is increased, the voltage V(gdrv) is dropped accordingly. The voltage V(gdrv) may be configured to drive (or control) the driving circuit 11 to generate the voltage V(out).

The driving circuit 11 may adjust the voltage V(out) in response to the adjusted voltage V(gdrv). For example, the voltage value of the voltage V(gdrv) may be negatively related to the voltage value of the voltage V(out). That is, when the voltage value of the voltage V(gdrv) is dropped, the voltage value of the voltage V(out) is increased. Accordingly, after the voltage value of the voltage V(out) is dropped instantaneously, the current change inside the regulator circuit 13 caused by the change of the voltage V(fb) may quickly reduce the voltage value of the voltage V(gdrv) and increase the voltage value of the voltage V(out). Thus, the voltage V(out) returns to a stable state.

In an exemplary embodiment, the current value of the current 41) (i.e., the first current value) may be positively related to the voltage value of the voltage (also referred to as the control voltage) V(buf). The voltage V(buf) is located at the output terminal of the response circuit 231 and/or the input terminal of the response circuit 232. The voltage value of the voltage V(buf) may be negatively related to the voltage value of the voltage V(gdrv). Therefore, when the current value of the current 41) (i.e., the first current value) is increased, the voltage value of the voltage V(buf) is also increased, but the voltage value of the voltage V(gdrv) is dropped.

In an exemplary embodiment, the response circuit 231 may also change the current value (also referred to as the second current value) of another current (also referred to as the second internal current) I(2) inside the regulator circuit 13 according to the change of the voltage V(fb). The current I(2) is also generated by dividing the current I(buf). In particular, the current value (i.e., the first current value) of the current 41) may be negatively related to the current value (i.e., the second current value) of the current I(2). That is, when the first current value is increased, the second current value is dropped.

From another perspective, the currents 41) and I(2) are generated by dividing the current I(buf). Therefore, the sum of the current value (i.e., the first current value) of the current 41) and the current value (i.e., the second current value) of the current I(2) may be substantially equal to the current value of the current I(buf). It should be noted that, the sum of the first current value and the second current value being substantially equal to the current value of the current I(buf) refers to the sum of the first current value and the second current value is approximately equal to the current value of the current I(buf) under the premise of including an allowable error.

In an exemplary embodiment, the response circuit 231 includes transistors 201 to 205. The transistor 201 is coupled to the regulator circuit 14. The transistor 201 may generate the current I(buf) according to the output of the regulator circuit 14. The transistors 202 and 203 are coupled to the transistor 201, the feedback circuit 22, and the response circuit 232. The transistors 204 and 205 are coupled to the transistor 201 and the feedback circuit 22.

In an exemplary embodiment, the transistor 201 is also called a first transistor, the transistors 202 and 203 are also called second transistors, and the transistors 204 and 205 are also called third transistors. The second transistors (i.e., the transistors 202 and 203) and the third transistors (i.e., the transistors 204 and 205) may divide the current I(buf) to generate the currents 41) and I(2), respectively. Moreover, the second transistors (i.e., the transistors 202 and 203) and the third transistors (i.e., the transistors 204 and 205) may respectively adjust the current value of the current 41) (i.e., the first current value) and the current value of the current I(2) (i.e., the second current value) according to the voltage V(fb).

In an exemplary embodiment, the transistors 204 and 205 may receive the voltages V(ref) and V(fb), respectively. The transistors 204 and 205 may adjust the current I(2) according to the voltages V(ref) and V(fb). When the voltage value of the voltage V(fb) is dropped suddenly, the current value (i.e., the second current value) of the current I(2) is also correspondingly dropped, and the current value (i.e., the first current value) of the current 41) is correspondingly increased. Moreover, the transistor 202 may receive the voltage V(fb) and be coupled to the transistor 204. In response to an increase in the current value of the current I(1) (i.e., the first current value) (and a drop in the voltage value of the voltage V(fb)), the voltage V(buf) located at the output terminal of the transistor 203 is also correspondingly increased.

In an exemplary embodiment, the response circuit 232 includes transistors 206 and 207, and the driving circuit 11 includes a transistor 208. In an exemplary embodiment, the transistors 206 and 207 are also called fourth transistors, and the transistor 208 is also called the fifth transistor. The fourth transistor may be coupled to the second transistor and the fifth transistor. The fourth transistors (i.e., the transistors 206 and 207) may detect the change of the first current value (i.e., the current value of the current 41)) via the second transistors (i.e., the transistors 202 and 203) and adjust the driving voltage (i.e., the voltage V(gdrv)) of the driving circuit 11 in response to the change. For example, a change of the first current value (i.e., the current value of the current 41)) may be reflected in the voltage V(buf). Therefore, the fourth transistors (i.e., the transistors 206 and 207) may adjust the voltage V(gdrv) according to the change of the voltage V(buf). The fifth transistor (i.e., the transistor 208) may change the voltage V(out) in response to the change of the driving voltage (i.e., the voltage V(gdrv)).

In an exemplary embodiment, the regulator circuit 14 includes an error amplifier 24. The error amplifier 24 may be configured to compare the voltage V(ref) with the voltage V(fb). The error amplifier 24 may control the current (i.e., the input current) I(buf) inside the regulator circuit 13 according to the comparison result between the voltage V(ref) and the voltage V(fb). For example, the difference between the voltage V(ref) and the voltage V(fb) may be positively related to the current value of the current I(buf). That is, if the comparison result reflects an increase in the difference between the voltage V(ref) and the voltage V(fb), as the voltage V(fb) is dropped more, the error amplifier 24 may control the transistor 201 to increase the current value of the current I(buf). In an exemplary embodiment, increasing the current value of the current I(buf) also helps to restore the voltage V(out) to a stable state.

Figure 3:
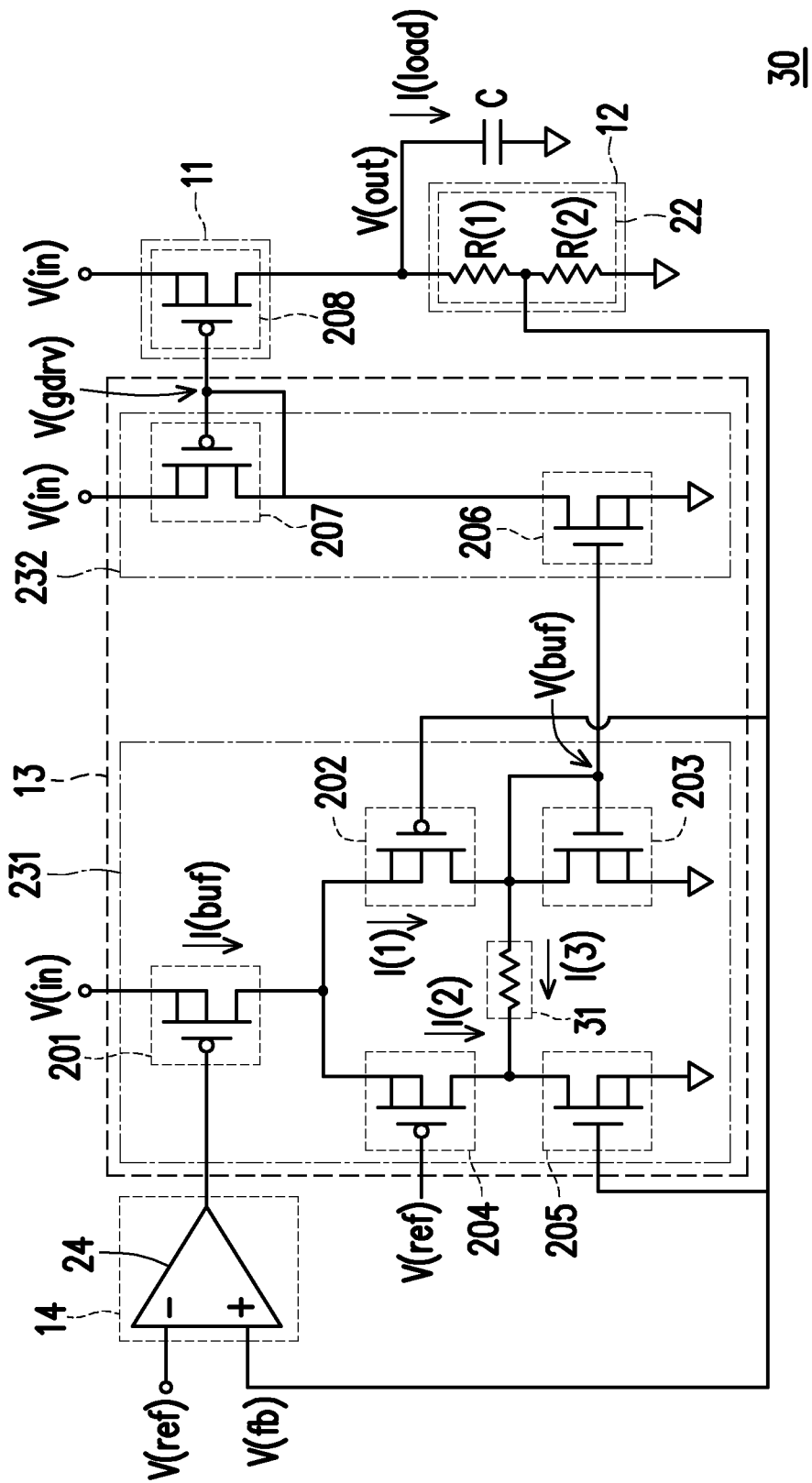
FIG. 3 is a schematic diagram of a regulator circuit module shown according to an exemplary embodiment of the invention.

FIG. 3 is a schematic diagram of a regulator circuit module shown according to an exemplary embodiment of the invention. Referring to FIG. 3, compared with the regulator circuit module 20 of FIG. 2, a regulator circuit module 30 further includes an impedance element 31. The impedance element 31 may be coupled between the second transistors (i.e., the transistors 202 and 203) and the third transistors (i.e., the transistors 204 and 205). The impedance element 31 may change the current value of the current I(3) (also known as the third current value) flowing through the impedance element 31 in response to a change of the second current value (i.e., the current value of the current I(2)) (and/or a change of the voltage difference at two ends of the impedance element 31).

In an exemplary embodiment, changing the current value (i.e., the third current value) of the current I(3) may also include changing the flow direction of the current I(3). Next, the response circuit 232 may adjust the driving voltage (i.e., the voltage V(gdrv)) of the driving circuit 11 (or the transistor 208) according to the change of the third current value (and/or the change of the flow direction of the current I(3)). For example, the impedance element 31 may include an electronic element such as a resistor, a reactance, a transistor, and/or a diode, which have the function of providing impedance and/or rectification.

In an exemplary embodiment, compared with the regulator circuit module 20 of FIG. 2, the regulator circuit module 30 may further increase the voltage value of the voltage V(buf) via the changed current I(3). Thereby, the efficiency of reducing the voltage V(gdrv) and increasing the voltage V(out) may also be improved.

Figure 4:
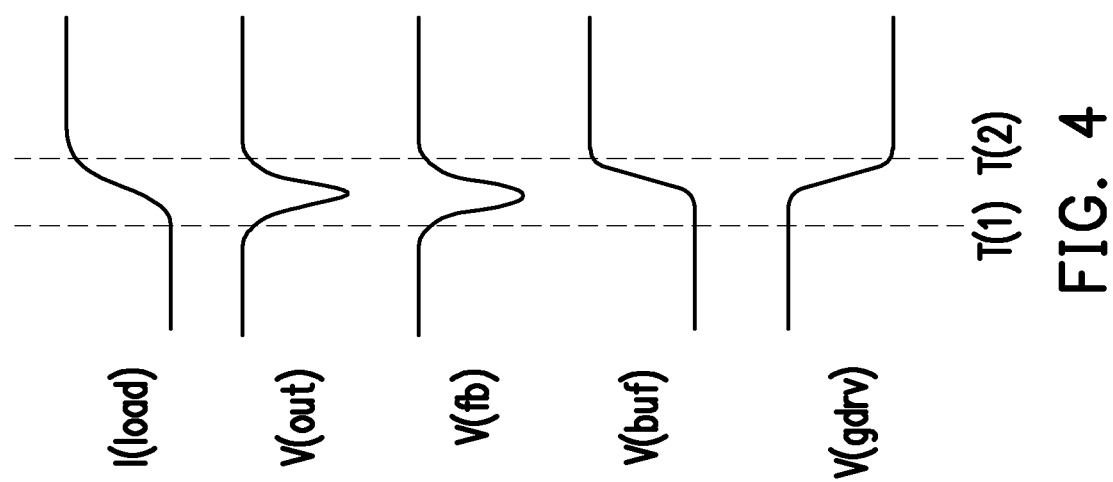
FIG. 4 is a schematic diagram of signal timing for adjusting an output voltage in response to a current change caused by a feedback voltage shown according to an exemplary embodiment of the invention.

FIG. 4 is a schematic diagram of signal timing for adjusting an output voltage in response to a current change caused by a feedback voltage shown according to an exemplary embodiment of the invention. Referring to FIG. 2, FIG. 3, and FIG. 4, it is assumed that at time point T(1), the current value of the current I(load) is increased instantaneously, and the voltage value of the voltage V(out) is dropped instantaneously. In response to the drop in the voltage value of the voltage V(out), the voltage value of the voltage V(fb) is also dropped correspondingly. In response to the drop in the voltage value of the voltage V(fb), the voltage value of the voltage V(buf) is correspondingly increased. In response to an increase in the voltage value of the voltage V(buf), the voltage value of the voltage V(gdrv) is correspondingly dropped. In response to the drop in the voltage value of the voltage V(gdrv), the voltage value of the voltage V(out) may be rapidly increased. Thereby, in a very short period of time, at time point T(2), the voltage V(out) may be restored to a stable state (e.g., the voltage value of the voltage V(out) may be restored to a predetermined value).

In an exemplary embodiment, the regulator circuit module 10, 20, or 30 of FIG. 1 to FIG. 3 may be disposed in a memory storage device. Alternatively, in an exemplary embodiment, the regulator circuit modules 10, 20, or 30 of FIG. 1 to FIG. 3 may be disposed in other types of electronic devices.

Figure 5:
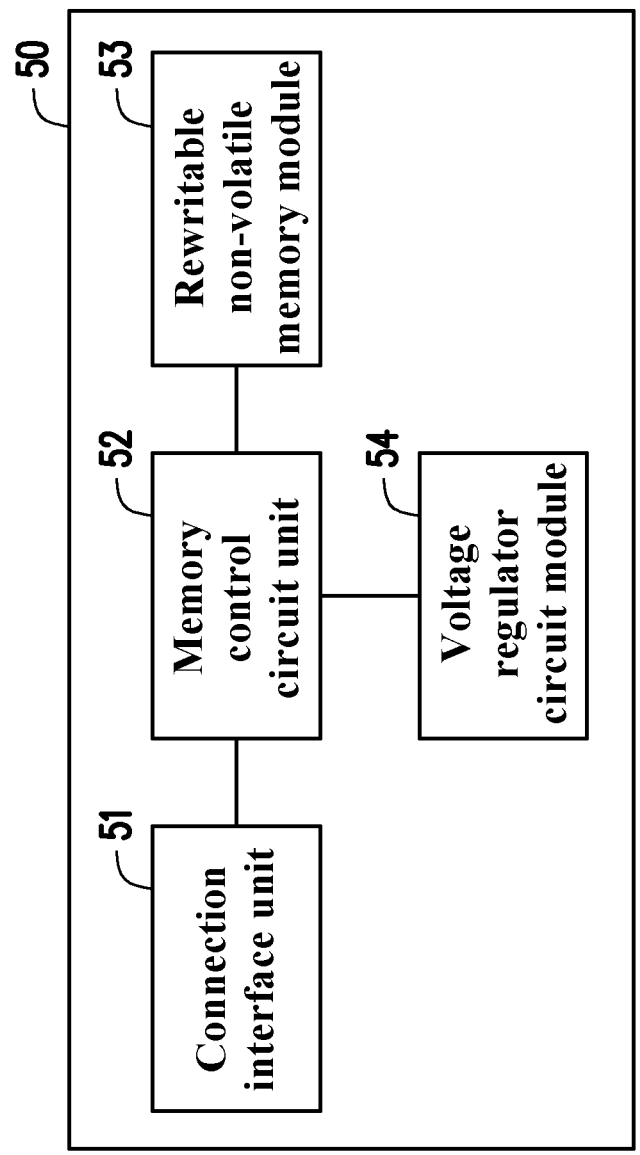
FIG. 5 is a schematic diagram of a memory storage device shown according to an exemplary embodiment of the invention.

FIG. 5 is a schematic diagram of a memory storage device shown according to an exemplary embodiment of the invention. Referring to FIG. 5, a memory storage device 50 includes a connection interface unit 51, a memory control circuit unit 52, a rewritable non-volatile memory module 53, and a regulator circuit module 54.

The connection interface unit 51 is configured to couple the memory storage device 50 to the host system 11. The memory storage device 50 may be communicated with the host system via the connection interface unit 51. In an exemplary embodiment, the connection interface unit 51 is compatible with the Peripheral Component Interconnect Express (PCI Express) standard. In an exemplary embodiment, the connection interface unit 51 may also conform to Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 51 may be sealed in a chip with the memory control circuit unit 52. Alternatively, the connection interface unit 51 is disposed outside of a chip containing the memory control circuit unit 52.

The memory control circuit unit 52 is coupled to the connection interface unit 51 and the rewritable non-volatile memory module 53. The memory control circuit unit 52 is configured to execute a plurality of logic gates or control commands implemented in a hardware form or in a firmware form and perform operations such as writing, reading, and erasing data in the rewritable non-volatile memory storage module 53 according to the commands of the host system.

The rewritable non-volatile memory module 53 is configured to store the data written by the host system. The rewritable non-volatile memory module 53 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 53 stores one or a plurality of bits via the change of voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 53 has a plurality of storage states. Which storage state one memory cell belongs to may be determined via the application of a read voltage, so as to obtain one or a plurality of bits stored by the memory cell.

In an exemplary embodiment, the memory cells of the rewritable non-volatile memory module 53 may form a plurality of physical programming units, and these physical programming units may form a plurality of physical erasing units. Specifically, the memory cells on the same word line may form one or a plurality of physical programming units. If one memory cell may store two or more bits, the physical programming units on the same word line may at least be classified into lower physical programming units and upper physical programming units. For example, the least significant bit (LSB) of a memory cell belongs to the lower physical programming unit, and the most significant bit (MSB) of a memory cell belongs to the upper physical programming unit. Generally, in an MLC NAND-type flash memory, the write speed of the lower physical programming unit is greater than the write speed of the upper physical programming unit, and/or the reliability of the lower physical programming unit is greater than the reliability of the upper physical programming unit.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming units may include a data bit area and a redundant bit area. The data bit area contains a plurality of physical pages configured to store user data, and the redundant bit area is configured to store system data (for example, management data such as an error correction code). In an exemplary embodiment, the data bit area contains 32 physical pages, and the size of one physical sector is 512 bytes (B). However, in other exemplary embodiments, the data bit area may also contain 8, 16, or a greater or lesser number of physical pages, and the size of each of the physical pages may also be greater or smaller. Moreover, the physical erasing unit is the smallest unit of erasing. That is, each of the physical erase units contains the smallest number of memory cells erased together. For example, the physical erasing unit is a physical block.

The regulator circuit module 54 may include the regulator circuit module 10, 20, or 30 of FIG. 1 to FIG. 3. The regulator circuit module 54 may be disposed inside the memory storage device 50 and coupled to at least one of the connection interface unit 51, the memory control circuit unit 52, and the rewritable non-volatile memory module 53 to perform the associated regulation operation. Alternatively, the regulator circuit module 54 may also be disposed inside at least one of the connection interface unit 51, the memory control circuit unit 52, and the rewritable non-volatile memory module 53. For details of the implementation of the regulator circuit module 54, please refer to the exemplary embodiments of FIG. 1 to FIG. 3, and details are not repeated herein.

Figure 6:
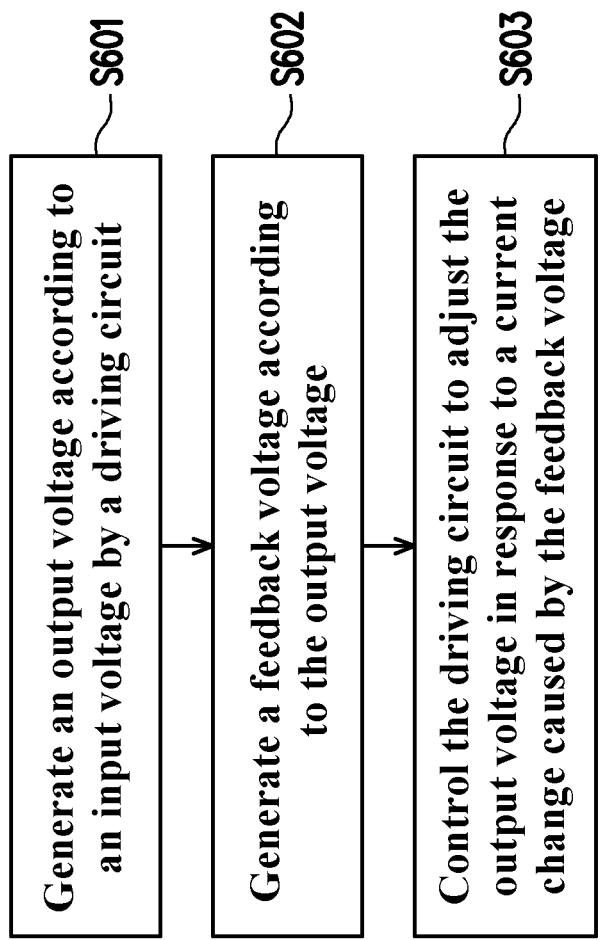
FIG. 6 is a flowchart of a voltage control method shown according to an exemplary embodiment of the invention.

FIG. 6 is a flowchart of a voltage control method shown according to an exemplary embodiment of the invention. Referring to FIG. 6, in step S601, an output voltage is generated according to an input voltage by a driving circuit. In step S602, a feedback voltage is generated according to the output voltage. In step S603, in response to a current change caused by the feedback voltage, a first regulator circuit controls the driving circuit to adjust the output voltage.

However, each step in FIG. 6 is as described in detail above, and is not repeated herein. It should be mentioned that, each step in FIG. 6 may be implemented as a plurality of program codes or circuits, and the present application is not limited thereto. Moreover, the method of FIG. 6 may be used with the above exemplary embodiments, and may also be used alone, and the present application is not limited thereto.

Based on the above, the regulator circuit module, the memory storage device, and the voltage control method provided by the embodiments of the invention can, after the driving circuit generates the output voltage according to the input voltage, control the driving circuit to adjust the output voltage according to the current change caused by the feedback voltage generated by the feedback circuit. In particular, by detecting the current change (not voltage change) caused by the feedback voltage in the response circuit, the efficiency of returning the output voltage to a stable state may be effectively improved.

Although the disclosure has been disclosed by the above embodiments, they are not intended to limit the disclosure. It is apparent to one of ordinary skill in the art that modifications and variations to the disclosure may be made without departing from the spirit and scope of the disclosure. Accordingly, the protection scope of the disclosure will be defined by the appended claims.

What is claimed is:

1. A regulator circuit module, comprising:
a driving circuit configured to generate an output voltage according to an input voltage;
a feedback circuit coupled to the driving circuit and configured to generate a feedback voltage according to the output voltage;
a second regulator circuit coupled to the feedback circuit and configured to generate an output according to a reference voltage and the feedback voltage; and
a first regulator circuit coupled to the second regulator circuit, the driving circuit and the feedback circuit,
wherein the first regulator circuit is configured to receive the output of the second regulator circuit and the feedback voltage and control the driving circuit to adjust the output voltage in response to the output of the second regulator circuit and a current change caused by the feedback voltage.

2. The regulator circuit module of claim 1, wherein the second regulator circuit comprises an error amplifier, and the error amplifier is configured to compare the reference voltage with the feedback voltage and control the input current of the first regulator circuit according to a comparison result.

3. The regulator circuit module of claim 1, wherein the first regulator circuit comprises:
a first response circuit coupled to the feedback circuit and the second regulator circuit; and
a second response circuit coupled to the first response circuit and the driving circuit,
wherein the first response circuit is configured to change a first current value of a first internal current in the first regulator circuit according to a change of the feedback voltage, and the first internal current is generated by dividing the input current,
the second response circuit is configured to adjust a driving voltage of the driving circuit according to a change of the first current value, and
the driving circuit adjusts the output voltage in response to the adjusted driving voltage.

4. The regulator circuit module of claim 3, wherein the first response circuit is further configured to change a second current value of a second internal current in the first regulator circuit according to the change of the feedback voltage, the second internal current is generated by dividing the input current, and the first current value is negatively related to the second current value.

5. The regulator circuit module of claim 4, wherein a sum of the first current value and the second current value is equal to a current value of the input current.

6. The regulator circuit module of claim 4, wherein the first response circuit comprises:
a first transistor coupled to the second regulator circuit;
a second transistor coupled to the first transistor, the feedback circuit, and the second response circuit; and
a third transistor coupled to the first transistor and the feedback circuit,
the first transistor is configured to generate the input current according to an output of the second regulator circuit,
the second transistor and the third transistor respectively perform the dividing of the input current to generate the first internal current and the second internal current, and
the second transistor and the third transistor respectively adjust the first current value and the second current value according to the feedback voltage.

7. The regulator circuit module of claim 6, wherein the second response circuit comprises a fourth transistor, the driving circuit comprises a fifth transistor, and the fourth transistor is coupled to the second transistor and the fifth transistor,
the fourth transistor is configured to detect the change of the first current value by the second transistor and adjust the driving voltage of the driving circuit in response to the change, and
the fifth transistor changes the output voltage in response to a change of the driving voltage.

8. The regulator circuit module of claim 6, wherein the first regulator circuit further comprises:
an impedance element coupled between the second transistor and the third transistor,
the impedance element is configured to change a third current value of a third current flowing through a rectifying element in response to a change of the second current value, and
the second response circuit is further configured to adjust the driving voltage of the driving circuit according to a change of the third current value.

9. The regulator circuit module of claim 1, wherein the feedback circuit comprises:
a voltage dividing circuit configured to divide the output voltage to generate the feedback voltage.

10. A memory storage device, comprising:
a connection interface unit configured to be coupled to a host system;
a rewritable non-volatile memory module;
a memory control circuit unit; and a regulator circuit module coupled to at least one of the connection interface unit, the rewritable non-volatile memory module, and the memory control circuit unit, wherein the regulator circuit module is configured to:
generate an output voltage according to an input voltage by a driving circuit;
generate a feedback voltage based on the output voltage by a feedback circuit;
generate an output according to a reference voltage and the feedback voltage by a second regulator circuit coupled to the feedback circuit; and
receive the output of the second regulator circuit and the feedback voltage and control the driving circuit to adjust the output voltage by a first regulator circuit coupled to the second regulator circuit in response to the output of the second regulator circuit and a current change caused by the feedback voltage.

11. The memory storage device of claim 10, wherein the second regulator circuit comprises an error amplifier, and
the error amplifier is configured to compare the reference voltage with the feedback voltage and control the input current of the first regulator circuit according to a comparison result.

12. The memory storage device of claim 10, wherein the first regulator circuit comprises:
a first response circuit coupled to the second regulator circuit; and
a second response circuit coupled to the first response circuit and the driving circuit,
wherein the first response circuit is configured to change a first current value of a first internal current in the first regulator circuit according to a change of the feedback voltage, and the first internal current is generated by dividing the input current,
the second response circuit is configured to adjust a driving voltage of the driving circuit according to a change of the first current value, and
the driving circuit adjusts the output voltage in response to the adjusted driving voltage.

13. The memory storage device of claim 12, wherein the first response circuit is further configured to change a second current value of a second internal current in the first regulator circuit according to the change of the feedback voltage, the second internal current is generated by dividing the input current, and the first current value is negatively related to the second current value.

14. The memory storage device of claim 13, wherein a sum of the first current value and the second current value is equal to a current value of the input current.

15. The memory storage device of claim 13, wherein the first response circuit comprises:
a first transistor coupled to the second regulator circuit;
a second transistor coupled to the first transistor and the second response circuit; and
a third transistor coupled to the first transistor,
the first transistor is configured to generate the input current according to an output of the second regulator circuit,
the second transistor and the third transistor respectively perform the dividing of the input current to generate the first internal current and the second internal current, and
the second transistor and the third transistor respectively adjust the first current value and the second current value according to the feedback voltage.

16. The memory storage device of claim 15, wherein the second response circuit comprises a fourth transistor, the driving circuit comprises a fifth transistor, and the fourth transistor is coupled to the second transistor and the fifth transistor,
the fourth transistor is configured to detect the change of the first current value by the second transistor and adjust the driving voltage of the driving circuit in response to the change, and
the fifth transistor changes the output voltage in response to a change of the driving voltage.

17. The memory storage device of claim 15, wherein the first regulator circuit further comprises:
an impedance element coupled between the second transistor and the third transistor,
the impedance element is configured to change a third current value of a third current flowing through a rectifying element in response to a change of the second current value, and
the second response circuit is further configured to adjust the driving voltage of the driving circuit according to a change of the third current value.

18. The memory storage device of claim 10, wherein the regulator circuit module comprises:
a voltage dividing circuit configured to divide the output voltage to generate the feedback voltage.

19. A voltage control method, configured for a memory storage device, the voltage control method comprising:
generating an output voltage according to an input voltage by a driving circuit;
generating a feedback voltage based on the output voltage by a feedback circuit;
generating an output according to a reference voltage and the feedback voltage by a second regulator circuit coupled to the feedback circuit; and
receiving the output of the second regulator circuit and the feedback voltage and controlling the driving circuit to adjust the output voltage by a first regulator circuit coupled to the second regulator circuit in response to the output of the second regulator and a current change caused by the feedback voltage.

20. The voltage control method of claim 19, wherein the step of controlling the input current of the first regulator circuit according to the feedback voltage by the second regulator circuit comprises:
comparing the reference voltage with the feedback voltage; and
controlling the input current of the first regulator circuit according to a comparison result.

21. The voltage control method of claim 19, wherein in response to the current change caused by the feedback voltage, the step of controlling the driving circuit to adjust the output voltage by the first regulator circuit comprises:
changing a first current value of a first internal current in the first regulator circuit according to a change of the feedback voltage, and the first internal current is generated by dividing the input current;
adjusting a driving voltage of the driving circuit according to a change of the first current value; and
adjusting the output voltage in response to the adjusted driving voltage by the driving circuit.

22. The voltage control method of claim 21, wherein in response to the current change caused by the feedback voltage, the step of controlling the driving circuit to adjust the output voltage by the first regulator circuit further comprises:
changing a second current value of a second internal current in the first regulator circuit according to the change of the feedback voltage, the second internal current is generated by dividing the input current, and the first current value is negatively related to the second current value.

23. The voltage control method of claim 22, wherein a sum of the first current value and the second current value is equal to a current value of the input current.

24. The voltage control method of claim 22, wherein in response to the current change caused by the feedback voltage, the step of controlling the driving circuit to adjust the output voltage by the first regulator circuit further comprises:
generating the input current according to an output of the second regulator circuit by a first transistor;
dividing the input current by a second transistor and a third transistor to generate the first internal current and the second internal current; and
adjusting the first current value and the second current value according to the feedback voltage respectively by the second transistor and the third transistor.

25. The voltage control method of claim 24, wherein in response to the current change caused by the feedback voltage, the step of controlling the driving circuit to adjust the output voltage by the first regulator circuit further comprises:
detecting the change of the first current value by the second transistor by the fourth transistor and adjusting the driving voltage of the driving circuit in response to the change; and
changing the output voltage in response to a change of the driving voltage by the fifth transistor.

26. The voltage control method of claim 24, wherein in response to the current change caused by the feedback voltage, the step of controlling the driving circuit to adjust the output voltage by the first regulator circuit further comprises:
changing a third current value of a third current flowing through a rectifying element in response to a change of the second current value, wherein the rectifying element is coupled between the second transistor and the third transistor; and
adjusting the driving voltage of the driving circuit according to a change of the third current value.

27. The voltage control method of claim 19, further comprising:
dividing the output voltage to generate the feedback voltage.

* * * * *